(12) United States Patent
Furukawa

(10) Patent No.: US 9,104,245 B2
(45) Date of Patent: Aug. 11, 2015

(54) OPERATION INPUT DEVICE

(75) Inventor: Kenichi Furukawa, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 197 days.

(21) Appl. No.: 13/984,564

(22) PCT Filed: Feb. 13, 2012

(86) PCT No.: PCT/JP2012/053305
§ 371 (c)(1),
(2), (4) Date: Aug. 9, 2013

(87) PCT Pub. No.: WO2012/111631
PCT Pub. Date: Aug. 23, 2012

(65) Prior Publication Data
US 2013/0314325 A1    Nov. 28, 2013

(30) Foreign Application Priority Data
Feb. 18, 2011    (JP) .................................. 2011-033822

(51) Int. Cl.
*G06F 3/02* (2006.01)
*G06F 3/0338* (2013.01)
*H01H 15/10* (2006.01)
*H01H 36/00* (2006.01)
*H03K 17/97* (2006.01)
*H03K 17/975* (2006.01)

(52) U.S. Cl.
CPC ................ *G06F 3/02* (2013.01); *G06F 3/0338* (2013.01); *H01H 15/10* (2013.01); *H01H 36/00* (2013.01); *H03K 17/97* (2013.01); *H03K 17/975* (2013.01); *H01H 2239/024* (2013.01)

(58) Field of Classification Search
CPC ....... G06F 3/02; G06F 3/0338; H03K 17/975; H03K 17/97; H01H 36/00; H01H 15/10
USPC .................................. 345/156, 168, 169, 172
See application file for complete search history.

(56) References Cited

U.S. PATENT DOCUMENTS

| 7,395,100 | B2 * | 7/2008 | Cha et al. ................... 455/575.1 |
| 2004/0067784 | A1 | 4/2004 | Kubo et al. |
| 2009/0167697 | A1 * | 7/2009 | Okada et al. .................. 345/169 |

FOREIGN PATENT DOCUMENTS

| JP | 2000-235448 | 8/2000 |
| JP | 2001-119467 | 4/2001 |
| JP | 2003-058299 | 2/2003 |
| JP | 2009-003823 | 1/2009 |
| JP | 2011-003536 | 1/2011 |
| WO | WO 2010/134558 | 11/2010 |

OTHER PUBLICATIONS

International Search Report mailed on Mar. 27, 2012.

* cited by examiner

*Primary Examiner* — Adam R Giesy
(74) *Attorney, Agent, or Firm* — IPUSA, PLLC

(57) ABSTRACT

An operation input device (1) includes a directional key (10) and coils (71a-74a). The directional key (10) is accommodated within a case (60) when a slide part (120) is slid in a closing direction to be in a closed state, is displaced to a position protruding from an opening part (61) of the case (60) when the slide part (120) slides in an opening direction to be in an open state, and is displaced inward from the opening part (61) when an operation input is applied while the slide part (120) is in the open state. The coils (71a-74a) detect the position of the directional key (10) in a non-tactile manner and output a signal according to the amount of displacement of the directional key (10). The signal output from the coils is used to determine whether the slide part (120) is in the open or closed state.

8 Claims, 4 Drawing Sheets

OPERATION INPUT DEVICE

TECHNICAL FIELD

The present invention relates to an operation input device that outputs a signal according to the amount of displacement of an operating member that is displaced by the action of an operation input.

BACKGROUND ART

An information processing apparatus that exposes or shields a key top surface of a keyboard by sliding a cover in a direction parallel to the key top surface may include means for raising and lowering the key tops of the keyboard according to the sliding movement of the cover (See e.g., Patent Document 1). Such an information processing apparatus may use a membrane switch that is turned on when a key top is pushed downward by the sliding movement of the cover.

PRIOR ART DOCUMENTS

Patent Documents

Patent Document 1: Japanese Laid-Open Patent Publication No. 2003-058299

SUMMARY OF THE INVENTION

Problem to be Solved by the Invention

As exemplified by the above information processing apparatus, technology is developing for configuring an operation input device to output more than just ON/OFF signals of a key top. That is, efforts are being made to develop an operation input device that can output a signal according to the amount of displacement (i.e., operation input amount) of an operating member that is displaced by the action of an operation input.

However, in a case where such an operation input device uses a slide mechanism to enable an operating member to protrude from an opening part of a case when a slide part is slid in an opening direction to be in an open state, the open or closed state of the slide part cannot be detected unless a dedicated switch, such as a membrane switch is provided.

Means for Solving the Problem

It is a general object of at least one embodiment of the present invention to provide an operation input device that substantially obviates one or more problems caused by the limitations and disadvantages of the related art.

According to one embodiment of the present invention, an operation input device includes an operating member, which is accommodated in a case when a slide part is slid in a closing direction to be in a closed state, is displaced to a position protruding from an opening part of the case when the slide part slides in an opening direction to be in an open state, and is displaced inward from the opening part in response to an operation input that acts on the operating member while the slide part is in the open state. The operation input device also includes a detection mechanism that detects a position of the operating member in a non-tactile manner and outputs a signal according to the amount of displacement of the operating member. The operation input device uses the signal output by the detection mechanism to determine whether the slide part is in the open state or the closed state.

According to an aspect of the present invention, an operation input device may be capable of determining whether a slide part is in an open state or a closed state without using a dedicated switch.

EMBODIMENTS FOR IMPLEMENTING THE INVENTION

In the following, embodiments of the present invention are described with reference to the accompanying drawings.

An operation input device, according to an embodiment of the present invention, may be an operating interface that receives a force applied by a finger of an operator, for example, and outputs an output signal that varies depending on the received force. The output signal is used to detect an operation input made by the operator. By detecting the operation input, a computer may determine a corresponding operation to be implemented in response to the operation input.

The operation input device may be used, for example, in an electronic device such as a game console, a remote controller for television, a mobile terminal such as a cell phone or an audio player, a personal computer, or an electrical appliance. For example, the operator can move an object (e.g., a cursor, a pointer, or a character) displayed on a display screen of the electronic device using the operation input device. Also, the operator may supply a predetermined operation input using the operation input device, to execute a desired function of the electronic device.

Generally, the inductance L of an inductor or a coil is obtained by the following formula, where K represents a coefficient, μ represents permeability, n represents the number of turns of the coil, S represents the cross-sectional area of the coil, and d represents the length of the flux path of the coil:

$$L = K\mu n^2 S/d$$

As is apparent from the above formula, when parameters related to the shape of the coil, such as the number of turns, and the cross-sectional area are fixed, the inductance L can be changed by changing one or both of the permeability around the coil and the length of the flux path.

An exemplary operation input device that utilizes such a change in the inductance of a coil is described below. The operation input device receives a force applied by the user from the +Z direction in an orthogonal coordinate system defined by X, Y, and Z axes. The operation input device includes a displacement part. The position of the displacement part with respect to a coil changes in response to an operation input, and this causes the inductance of the coil to change. The operation input device detects the operation input by detecting the movement (or displacement) of the displacement part, which is displaced by the operation input made by the operator, based on a signal that varies depending on the magnitude of the inductance.

Figure 1:
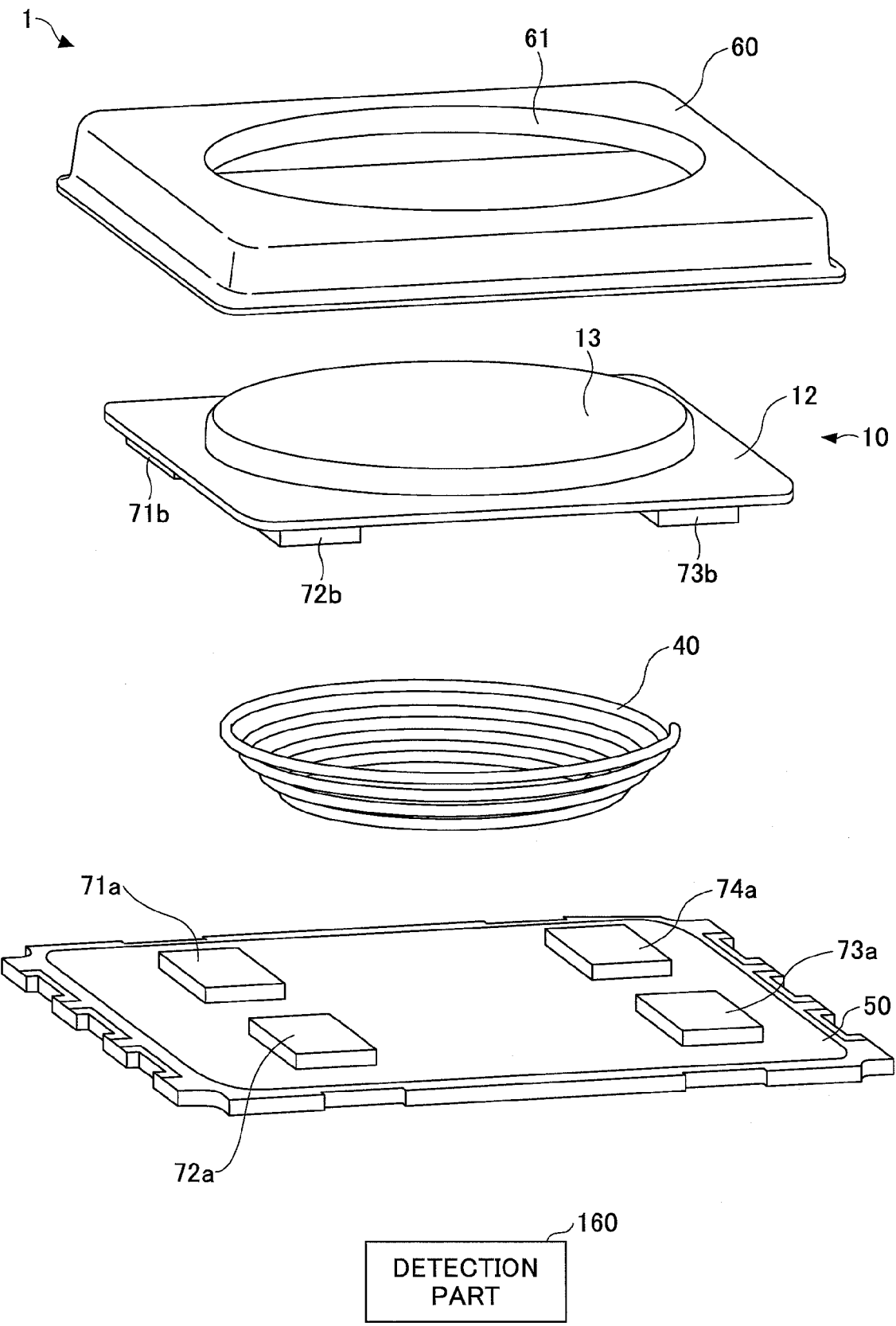
FIG. 1 is an exploded perspective view of an operation input device according to an embodiment of the present invention.
Figure 2:
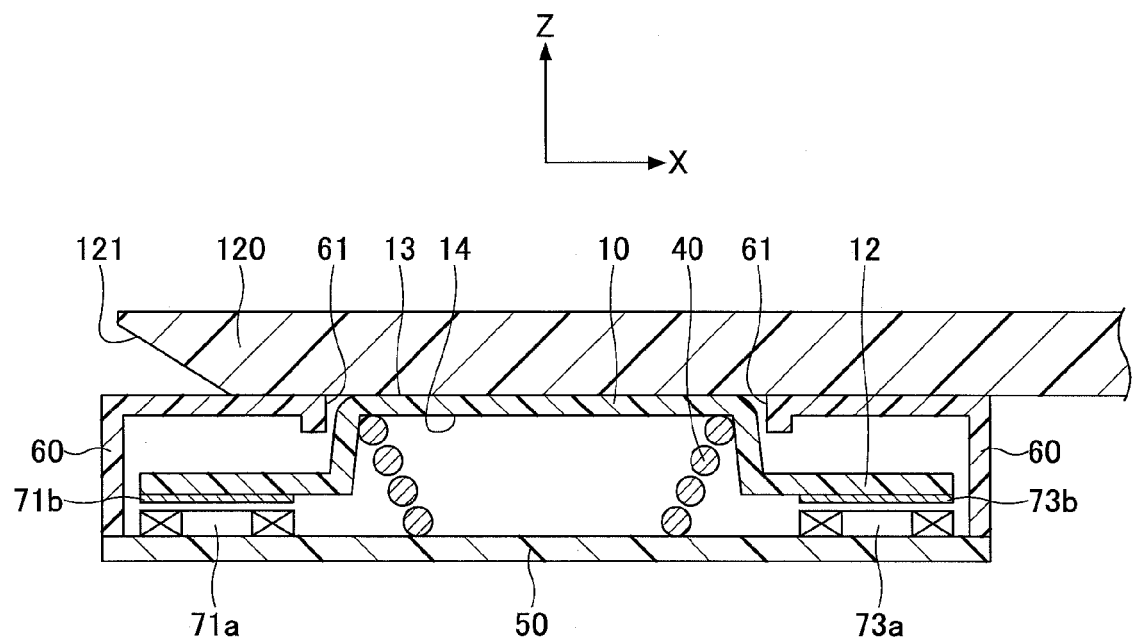
FIG. 2 is a cross-sectional view of the operation input device in a closed state.
Figure 3:
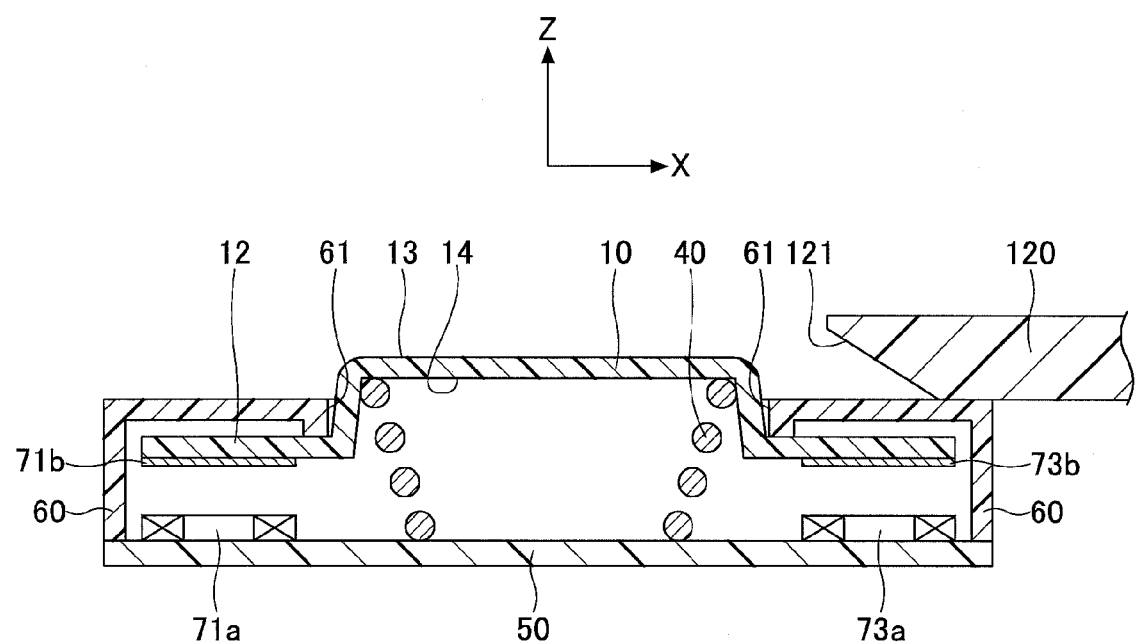
FIG. 3 is a cross-sectional view of the operation input device in an open state.
Figure 4:
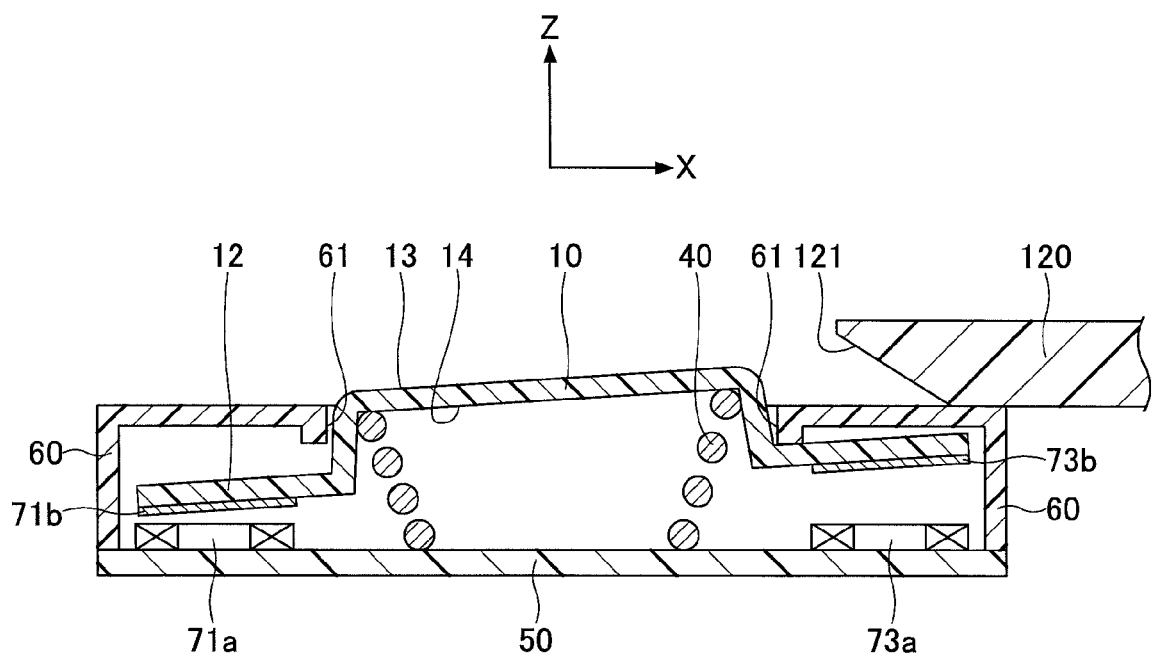
FIG. 4 is a cross-sectional view of the operation input device in a tilted state resulting from the action of an operation input for tilting a directional key toward a coil.

FIG. 1 is an exploded perspective view of an operation input device 1 according to an embodiment of the present invention. FIG. 2 is a cross-sectional view of the operation input device 1 in a closed state where a slide part 120 is slid in a closing direction. FIG. 3 is a cross-sectional view of the operation input device 1 in an open state where the slide part 120 is slid in an opening direction. FIG. 4 is a cross-sectional view of the operation input device 1 in a case where an operation input is made when the slide part 120 is in the open state and the action of the operation input causes a directional key 10 to be displaced to tilt toward a coil 71a. The slide part 120 may be a cover member of an electronic device such as a game console in which the operation input device 1 is installed, for example. The slide part 120 may be slid by a slide mechanism of the electronic device along an X-Y plane that is parallel to an operating face 13 of the directional key 10. The operation input device 1 includes the directional key 10 that is displaced by the action of an operation input, and the operation input device 1 is configured to output a signal according to the amount of displacement of the directional key 10.

In the following, a configuration of the operation input device 1 is described.

The operation input device 1 includes a substrate 50 having a mounting face on which a plurality of coils (four coils 71a, 72a, 73a, and 74a in the illustrated example) are mounted. The substrate 50 is a base member that has the mounting face arranged parallel to an X-Y plane. The substrate 50 may be a resin substrate (e.g., FR-4 substrate), or, provided adequate insulation can be secured, a metal plate substrate that includes a steel plate or a silicone steel plate as a base material so that the substrate 50 may function as a yoke.

The four coils 71a, 72a, 73a, and 74a are arranged along the circumference of a virtual circle that includes coordinate points that are equidistant from an origin O corresponding to a reference point of a three-dimensional orthogonal coordinate system defined by X, Y, and Z axes. The coils 71a, 72a, 73a, and 74a are preferably arranged at equidistant intervals along the circumference of the virtual circle in order to facilitate vector calculation of the force applied by the operator. In a case where the coils have the same characteristics, the distance between the gravitational centers of the coils that are adjacent to each other may be arranged to be equal. The coils may be arranged on the X-axis and the Y-axis in four directions, i.e., +X, −X, +Y, and −Y directions, at 90-degree-intervals. The −X direction corresponds to a direction 180 degrees opposite the +X direction on the X-Y plane, and the −Y direction corresponds to a direction 180 degrees opposite the +Y direction on the X-Y plane.

The coils may alternatively be arranged on 45-degree diagonal lines between the X-axis and the Y-axis on the X-Y plane in four directions, at 90-degree angle intervals along the circumference of the virtual circle. For example, the coil 73a may be arranged at the first quadrant, the coil 74a may be arranged at the second quadrant, the coil 71a may be arranged at the third quadrant, and the coil 72a may be arranged at the fourth quadrant.

The directional key 10 corresponds to an embodiment of an operating member that is accommodated within a case 60 when the slide part 120 is slid in the closing direction to be in the closed state as illustrated in FIG. 2, and is displaced to a position protruding from an opening part 61 of the case 60 when the slide part 120 is slid in the opening direction opposite the closing direction as illustrated in FIG. 3. Further, as illustrated in FIG. 4, the directional key 10 is an operating member that is displaced by the action of an operation input that is made while the slide part 120 is slid in the opening direction to be in the open state. The amount of displacement of the directional key 10 being displaced inward from the opening part 61 of the case 60 successively changes according to the input amount of the operation input.

The operation input device 1 of the present embodiment includes a detection mechanism that detects the position of the directional key 10 in a non-tactile manner and outputs a signal according to the amount of displacement of the directional key 10. The detection mechanism of the operation input device 1 of the present embodiment includes the coils 71a-74a, which have inductances that vary depending on the amount of displacement and the displacement direction of the directional key 10 and a detection part 160 (see FIG. 1).

The coils 71a-74a correspond to detection members that are configured to detect the position of the directional key 10 in a non-tactile manner using yokes 71b-74b that are fixed to the lower face of the directional key 10 and output signal waveforms according to the amount of displacement of the directional key 10. The coils 71a-74a may comprise wire (conductive wire) wound into cylindrical shapes, for example. Although the coils 71a-74a are preferably arranged into cylindrical shapes, the coils 71a-74a may also be arranged into polygonal shapes, for example. Also, for purposes of facilitating assembly and improving shock resistance, the coils 71a-74a may be wound around bobbins, for example.

The yokes 71b-74b are arranged on the lower face of a flange 12 of the directional key 10. The number of the yokes 71b-74b corresponds to the number of coils 71a-74a arranged on the substrate 50. The yokes 71b-74b are displaced in conjunction with the displacement of the directional key 10. The directional key 10 is arranged on the side of the coils 71a-74a that receives the force of the operation input made by the operator. The directional key 10 is a plate member that includes a lower face 14 that opposes the upper faces of the coils 71a-74a and an operating face 13 on which a force exerted by the operator may be directly or indirectly applied. The yokes 71b-74b are preferably made of a material with a relative permeability greater than 1. More preferably, the yokes 71b-74b may be made of a material with a relative permeability greater than or equal to 1.001. For example, steel (relative permeability=5000) may be used for the yokes 71b-74b. The yokes 71b-74b do not have to be separate components from the directional key 10 but may be integral components of the directional key 10 made of ferrite, for example. The yokes 71b-74b and the coils 71a-74a form pairs that are arranged to face each other. When the force of an operation input made by the operator is applied to the operating face 13 of the directional key 10, this causes the positions of the yokes 71b-74b arranged on the upper side of the upper faces of the coils 71a-74a to change, which in turn causes changes in the inductance of the coils 71a-74a.

The yokes 71b-74b may be arranged into cores that are configured to cause changes in the inductances of the coils 71a-74a by being displaced in a direction of central axes of the coils 71a-74a to enter interior hollow portions of the coils 71a-74a in response to the action of an operation input. In this case, if the coils 71a-74a are cylindrical coils, the yokes 71b-74b are preferably made of magnets that are arranged into cylindrical columns. If the coils 71a-74a are polygonal coils, the yokes 71b-74b are preferably made of magnets that are arranged into polygonal columns. In the case where the yokes 71b-74b are arranged into cores, a force exerted by the operator acting on the operating face 13 of the directional key 10 causes the positions of the yokes 71b-74b within the hollow portions of the coils 71a-74a to change, which in turn causes the inductance of the coils 71a-74a to change.

By detecting the inductance of the coils 71a-74a, the input direction of the operation input with respect to the origin O of the orthogonal coordinate system (input position of the operation input on the X-Y plane) and the input amount of the operation input (amount pushed in the Z direction) may be computed.

The operation input device 1 further includes a return spring 40 corresponding to an embodiment of a support member that is arranged below the directional key 10 to displaceably support the directional key 10. The return spring 40 is an elastic support member that elastically supports the directional key 10 in directions opposing the lower face 14 of the directional key 10 and the substrate 50 so that the distance between the yokes 71b-74b arranged on the lower face 14 of the directional key 10 and the coils 71a-74a arranged on the substrate 50 may be elastically changed.

The return spring 40 is preferably arranged between the substrate 50 and the lower face 14 of the directional key 10. The return spring 40 elastically supports the directional key 10 so that the yokes 71b-74b arranged on the directional key 10 and the coils 71a-74a arranged on the substrate 50 do not come into contact with each other even when the force of the operation input made by the operator acts on the directional key 10. The return spring 40 supports the directional key 10 so that the directional key 10 may tilt with respect to the X-Y plane that is orthogonal to the Z axis. The return spring 40 also supports the directional key 10 so that the directional key 10 may move in the Z axis direction. Further, the return spring 40 is an urging support member that supports the directional key 10 while urging the lower face 14 of the directional key 10 in a direction away from the coils 71a-74a that are arranged on the substrate 50.

The return spring 40 elastically supports the directional key 10 so that the operating face 13 of the directional key 10 is disposed parallel to the X-Y plane when a force of an operation input made by the operator is not applied thereto. The operating face 13 of the directional key 10 may be a flat surface, a convex surface with respect to the X-Y plane, or a concave surface with respect to the X-Y plane, for example. The operating face 13 of the directional key 10 may be arranged into a desired shape and configuration to improve operability for the operator. The shape of the operating face 13 of the directional key 10 may be arranged into a circular shape, an oval shape, or a polygonal shape, for example.

The return spring 40 is a coil spring that is configured to urge the directional key 10 from the interior of the case 60 toward the opening part 61. By arranging the return spring 40 into a conical spring, durability of the spring may be improved and the directional key 10 may tilt more easily with respect to the opening part 61, for example. While the directional key 10 is operated and is displaced downward, the return spring 40 constantly applies a force urging the directional key 10 to move upward to return to its initial position (i.e., position shown in FIG. 3) corresponding to where the directional key 10 would be positioned when no force is applied thereto. Although the return spring 40 is arranged into a conical spring in the present embodiment, the return spring 40 may alternatively be a cylindrical coil spring, or an endless elastic body (e.g., rubber), for example.

As illustrated in FIG. 3, the operation input device 1 has the directional key 10 installed in the case 60 in a manner such that the directional key 10 is urged to come into contact with the inner face of the case 60. That is, the directional key 10 comes into contact with a rib that is arrange to protrude downward from the opening part 61 of the case 60 and is supported by the reactive force of the return spring 40.

The case 60 may be a case or chassis of an electronic device such as a cell phone in which the operation input device 1 of the present embodiment is installed, for example. Alternatively, the operation input device 1 itself may include the case 60, for example. Although the opening part 61 formed at the upper face of the case 60 is arranged into a circular shape in the example illustrated in FIG. 1, the opening part 61 may be arranged into any desired shape corresponding to the shape of the directional key 10 including a polygonal shape such as a rectangle or an octagon, for example.

The case 60 may determine the maximum height up to which the directional key 10 may be raised by the force of the return spring 40 urging the directional key 10 upward. The maximum stroke of the directional key 10 is set within a certain range so that the position of the directional key 10 may be detected in a non-tactile manner. That is, the case 60 may define a space corresponding to the maximum stroke of the directional key 10. Also, when the directional key 10 is covered by the slide part 120 in the closed state, because the directional key 10 does not protrude from the opening part 61 of the case 60, a thinned section does not have to be arranged at the slide part 120.

The slide part 120 is configured to slide along the upper face of the case 60. The slide part 120 may be a part of the operation input device 1, for example. The slide part 120 includes a guide part 121 arranged at its sliding direction end. The guide part 121 is arranged to facilitate movement of the directional key 10 in a downward direction in response to the sliding movement of the lower face of the slide part 120 along the operating face 13 of the directional key 10. The guide part 121 of the slide part 120 may be arranged into a tapered shape or a curved shape, for example. In one preferred embodiment, the directional key 10 may also have a guide part for facilitating such movement arranged at a portion of the directional key 10 that comes into contact with the sliding direction end of the slide part 120.

The detection part 160 electrically detects a change in the inductance of the coil 71a, for example, and outputs a detection signal corresponding to a continuously changing analog value representing the amount of displacement of the yoke 71b (i.e., the amount of displacement of the directional key 10 or the amount of operation input to the directional key 10). The detection part 160 may be implemented by a detection circuit that is mounted on the substrate 50 of the operation input device 1 or some other substrate (not shown).

In the following, an exemplary case in which the detection part 160 detects a change in a certain inductance evaluation value as a change in the inductance of the coil 71a is described. The change in the inductance of the coils 72a-74a may be detected in a similar manner so that descriptions thereof are omitted.

For example, the detection part 160 may detect a physical quantity that changes in proportion to a change in the inductance of the coil 71a, and output the detected physical quantity as a value that is equivalent to the amount of displacement of the yoke 71b. Alternatively, the detector 160 may be configured to detect a physical quantity that changes in proportion to a change in the inductance of the coil 71a, calculate the inductance of the coil 71a based on the detected physical quantity, and output the calculated inductance as a value that is equivalent to the amount of displacement of the yoke 71b. Further, the detector 160 may be configured to calculate the amount of displacement of the yoke 71b based on the detected physical quantity or the calculated inductance and output the calculated amount of displacement.

In one preferred embodiment, the detector 160 may supply a pulse signal to the coil 71*a*, thereby causing the coil 71*a* to generate a signal waveform that changes according to the magnitude of the inductance of the coil 71*a*, and electrically detect a change in the inductance of the coil 71*a* based on the generated signal waveform.

For example, as the amount of downward displacement of the yoke 71*b* toward the upper face of the coil 71*a* (or displacement within the hollow space portion of the coil 71*a*) increases, the permeability around the coil 71*a* increases and as a result, the inductance of the coil 71*a* increases. As the inductance of the coil 71*a* increases, the amplitude of a pulse voltage waveform generated by the supplied pulse signal at the ends of the coil 71*a* also increases. Based on this phenomenon, the detection part 160 may be configured to detect the amplitude of the pulse voltage waveform as a physical quantity that changes in proportion to a change in the inductance of the coil 71*a*, and output the detected amplitude as a value that is equivalent to the amount of displacement of the yoke 71*b*. Alternatively, the detection part 160 may be configured to calculate the inductance of the coil 71*a* based on the detected amplitude, and output the calculated inductance as a value that is equivalent to the amount of displacement of the yoke 71*b*.

Also, as the inductance of the coil 71*a* increases, the slope of the waveform of a pulse current that flows through the coil 71*a* when the pulse signal is supplied decreases. Based on this phenomenon, the detection part 160 may be configured to detect the slope of the pulse current waveform as a physical quantity that changes in proportion to a change in the inductance of the coil 71*a*, and output the detected slope as a value that is equivalent to the amount of displacement of the yoke 71*b*. Alternatively, the detection part 160 may be configured to calculate the inductance of the coil 71*a* based on the detected slope, and output the calculated inductance as a value that is equivalent to the amount of displacement of the yoke 71*b*.

As described above, the operation input device 1 includes the directional key 10 as an operating member that is accommodated within the case 60 when the slide member 120 is slid in the closing direction to be in the closed state (see FIG. 2), is displaced to a position protruding from the opening part 61 of the case 60 when the slide part 120 is slid in the opening direction to be in the open state (see FIG. 3), and is displaced inward from the opening part 61 in response to an operation input that acts on the directional key 10 while the slide part 120 is in the open state (see FIG. 4). The operation input device 1 also includes the coils 71*a*-74*a* and the detection part 160 as a detection mechanism that detects the position of the directional key 10 in a non-tactile manner and outputs a signal according to the amount of displacement of the directional key 10. By arranging the operation input device 1 to have such a configuration, the open/closed state of the slide part 120 may be detected without a dedicated switch.

For example, when the slide part 120 is slid in the closing direction to be in the closed state as illustrated in FIG. 2, the directional key 10 is pushed by a downward force that evenly urges the direction key 10 downward in the Z direction against the upward urging force of the return spring 40. By having the entire face of the operating face 13 of the directional key 10 come into contact with the lower face of the slide part 120 to cause parallel displacement of the directional key 10 in the downward direction, all the yokes arranged at the directional key 10 may move closer to their corresponding coils arranged on the substrate 50 (in the case where the yokes are arranged into cores, all the yokes may enter the corresponding hollow portions of the coils). By arranging the yokes to move closer to the coils (or arranging the yokes to enter the hollow portions of the coils), the permeability around the coils may increase and the self inductances of the coils may increase to their maximum values.

Thus, when the coils 71*a*-74*a* or the detection part 160 continuously detect an inductance evaluation value when the directional key 10 is displaced to the accommodation position within the case 60 for at least a predetermined time period with respect to all the coils, it may be determined that the slide part 120 is in the closed state. On the other hand, when the inductance evaluation value when the directional key 10 is displaced to the accommodation position within the case 60 is not continuously detected for the predetermined time period with respect to at least one of the coils, it may be determined that the directional key 10 has been displaced to the accommodation position within the case 60 by that action of an operation input made while the slide part 120 was in the open state. In other words, the open/closed state of the slide part 120 may be determined based on whether the inductance evaluation value when the directional key 10 is displaced to the accommodation position within the case 60 is detected for at least a predetermined time period with respect to all the coils.

Also, when the slide part 120 is slid in the opening direction to be in the open state as illustrated in FIG. 3, the directional key 10 no longer receives the force in the Z direction exerted by the slide member 120, and is thereby displaced by the upward urging force of the return spring 40 to a position protruding from the opening part 61 of the case 60. Such parallel displacement of the directional key 10 in the upward direction causes all the yokes arranged at the directional key 10 to move away from the coils arranged on the substrate 50. In this way, the permeability around all the coils may decrease and the self inductances of the coils may be decreased to their minimum values.

Thus, in a case where the coils 71*a*-74*a* or the detection part 160 detect an inductance evaluation value that is different from the inductance evaluation when the directional key 10 is displaced at the accommodation position within the case 60 (e.g., an inductance evaluation value that is smaller than that when the directional key 10 is displaced at the accommodation position within the case 60) with respect to at least one of the coils, it may be determined that the slide part 120 is in the open state. Also, in a case where an inductance value when the directional key 10 is displaced to the position protruding from the opening part 61 of the case 60 is detected with respect to at least one of the coils, it may be determined that the slide part 120 is in the open state.

FIG. 4 is a cross-sectional view of the operation input device 1 in a tilted state resulting from the action of an operation input that tilts the directional key 10 toward the coil 71*a*. When the directional key 10 is pushed by a downward force in the Z direction against the upward urging force of the return spring 40 to tilt with respect to the substrate 50 via the flange 12 and/or the return spring 40, the yoke 71*b* moves closer to the coil 71*a* (or the yoke 71*b* enters the hollow portion of the coil 71*a* in the case where the yoke 71*b* is arranged into to a core). Such movement of the yoke 71*b* toward the coil 71*a* (or entry of the yoke 71*b* into the hollow portion of the coil 71*b*) causes the permeability around the coil 71*a* to increase, which in turn causes the self inductance of the coil 71*a* to increase. Note that similar effects may be obtained when the directional key 10 is tilted in other directions. Thus, the coils 71*a*-74*a* or the detection part 160 may determine the tilting direction and the stroke of the directional key 10 based on the inductance evaluation value detected with respect to each coil.

Note that although certain preferred embodiments of the present invention have been described above, the present invention is not limited to these embodiments and numerous variations and modifications may be made without departing from the scope of the present invention.

For example, although the operation input device 1 of the above-described embodiment is configured to detect the inductance of the coils that are arranged on the substrate 50 that oppose the yokes arranged on the directional key 10 to detect the stroke of the directional key 10 when it is displaced downward by the action of an operation input, in an alternative embodiment, the coils arranged on the substrate 50 may be replaced by yokes, and the yokes arranged on the directional key 10 may be replaced by coils, for example.

Also, although the operation input device 1 of the above-described embodiment uses a coil as a detection member for detecting a change in inductance resulting from the displacement of the operating member, in an alternative embodiment, a pair of electrodes may be used as a detection member for detecting a change in capacitance (electrostatic capacitance) resulting from the displacement of the operating member. That is, the coils arranged on the substrate 50 of the above-described operation input device 1 may be replaced by fixed electrodes, and the yokes arranged on the directional key 10 may be replaced by movable electrodes. In this case, the stroke when the directional key 10 is displaced downward by the action of an operation input may be detected by detecting the electrostatic capacitance between the fixed electrodes arranged on the substrate 50 and the movable electrode arranged at the directional key 10.

For example, a change in a certain electrostatic capacitance evaluation value may be detected as a change in the electrostatic capacitance between a pair of electrodes. The pairs of electrodes or the detection part 160 may determine whether the slide part 120 is in the open state or the closed state based on whether an electrostatic capacitance evaluation value when the directional key 10 is displaced to the accommodation position within the case 60 is detected for at least a predetermined time period with respect to all the pairs of electrodes.

Figure 5:
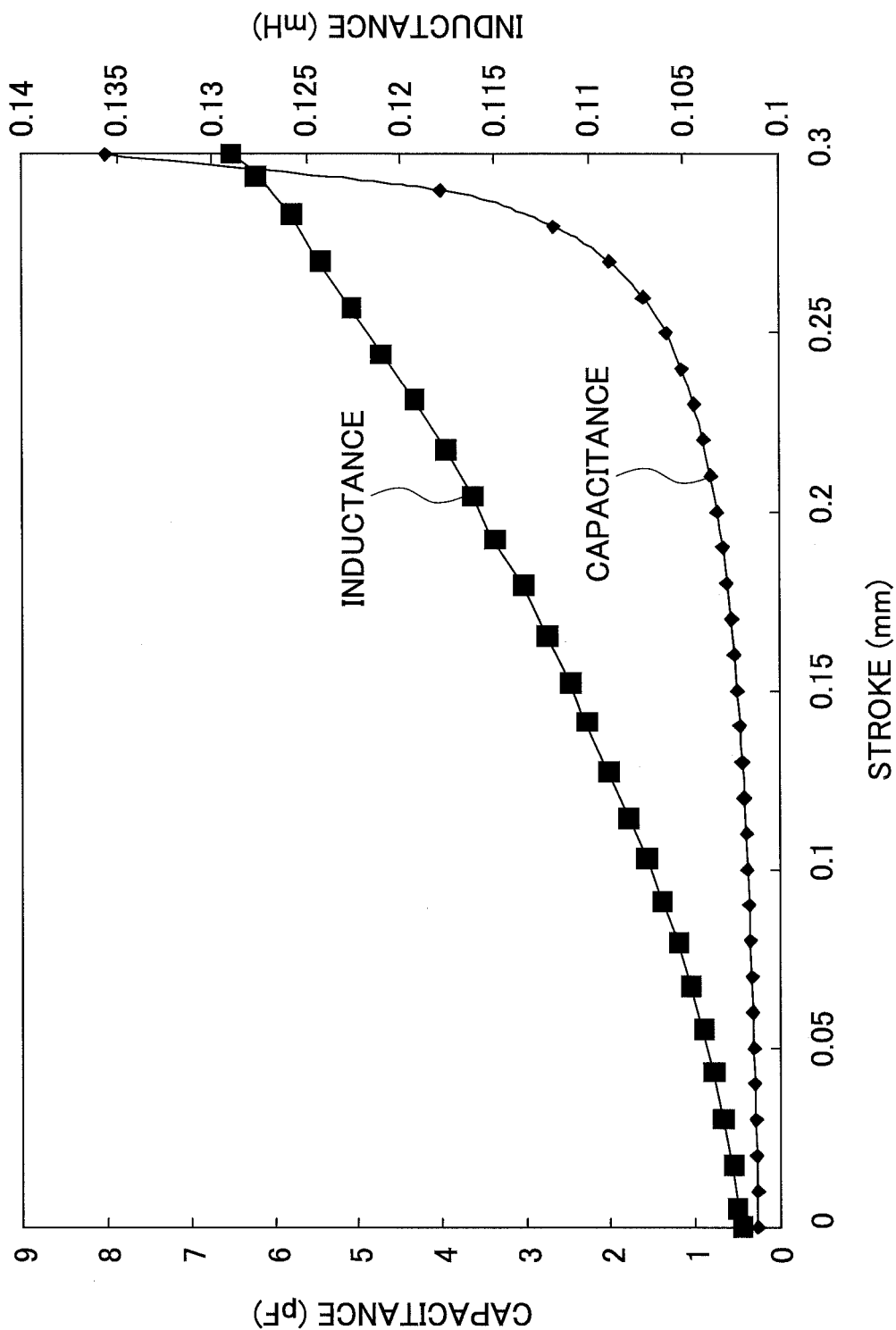
FIG. 5 is a graph illustrating an inductance and a capacitance in relation to the stroke of the directional key.

However, as illustrated in FIG. 5, because the inductance has a more linear relationship with the stroke of the directional key 10 compared to the capacitance even when the stroke is increased, operation input device 1, as described above, which detects the displacement of the directional key 10 based on the inductance of the coils, may be more advantageous compared to the case of detecting the displacement of the directional key 10 based on the electrostatic capacitance between electrodes. That is, the stroke of the directional key 10 may be designed to be larger in the case where the inductance is used. By designing the directional key 10 to have a larger stroke, operability may be improved because the operator may have a better sense of adjusting the stroke when making an analog operation input to the operation input device, for example.

Also, the support member that elastically supports the directional key 10 is not limited to an elastic member such as the return spring 40 as described above but may alternatively be a rubber member, a sponge member, or a cylinder filled with air or oil, for example.

Also, the operation input device of the present invention is not limited to an operating interface that is configured to be operated using fingers but may alternatively be operated by the hand, for example. The operation input device of the present invention may also be configured to be operated by the toes or feet, for example. Further, the operating face to be touched by the operator may be arranged into a flat surface, a concave surface, or a convex surface, for example.

Further, the present invention is not limited to these embodiments, and various changes and modifications may be made without departing from the scope of the present invention.

The present application is based on and claims the benefit of priority of Japanese Patent Application No. 2011-033822 filed on Feb. 18, 2011, the entire contents of which are herein incorporated by reference.

The invention claimed is:

1. An operation input device comprising:
   an operating member, which is accommodated within a case when a slide part is slid in a closing direction to be in a closed state, is displaced to a position protruding from an opening part of the case when the slide part slides in an opening direction to be in an open state, and is displaced inward from the opening part in response to an operation input that acts on the operating member while the slide part is in the open state; and
   a detection mechanism for detecting a position of the operating member in a non-tactile manner and outputting a signal according to the amount of displacement of the operating member;
   wherein the signal output by the detection mechanism is used to determine whether the slide part is in the open state or the closed state.

2. The operation input device as claimed in claim 1, further comprising:
   a support member that elastically supports the operating member by urging the operating member toward the opening part from inside the case.

3. The operation input device as claimed in claim 2, wherein
   the support member includes an elastic member that supports the operating member that is displaced by a sliding movement of the slide part and supports the operating member that is displaced by the operation input.

4. The operation input device as claimed in claim 1, wherein
   the operating member is configured to be displaced and tilted with respect to the opening part by the action of the operation input.

5. The operation input device as claimed in claim 1, wherein
   the detection mechanism determines whether the slide part is in the open state or the closed state based on whether an evaluation value when the operating member is displaced at an accommodation position within the case is detected for at least a predetermined time period.

6. The operation input device as claimed in claim 5, wherein
   the detection mechanism determines whether the slide part is in the open state or the closed state based on whether the evaluation value is detected for at least the predetermined time period with respect to all detection members of the detection mechanism that are configured to detect the position of the operating member in a non-tactile manner.

7. The operation input device as claimed in claim 1, wherein
   the detection mechanism includes a detection member that has an inductance that changes in response to a displacement of the operating member.

8. The operation input device as claimed in claim 1, wherein
   the detection mechanism includes a detection member that has a capacitance that changes in response to a displacement of the operating member.

* * * * *